United States Patent
Koyama et al.

(10) Patent No.: US 6,844,280 B2
(45) Date of Patent: Jan. 18, 2005

(54) FLAT GLASS HAVING HIGH TRANSMITTANCE

(75) Inventors: Akihiro Koyama, Osaka (JP); Isamu Kuroda, Osaka (JP); Nobuyuki Yamamoto, Osaka (JP); Yasunori Seto, Osaka (JP)

(73) Assignee: Nippon Sheet Glass Company, Limited, Tokyo (JP)

( * ) Notice: Subject to any disclaimer, the term of this patent is extended or adjusted under 35 U.S.C. 154(b) by 120 days.

(21) Appl. No.: 10/220,947

(22) PCT Filed: Mar. 6, 2001

(86) PCT No.: PCT/JP01/01707

§ 371 (c)(1),
(2), (4) Date: Sep. 6, 2002

(87) PCT Pub. No.: WO01/66477

PCT Pub. Date: Sep. 13, 2001

(65) Prior Publication Data

US 2003/0114291 A1 Jun. 19, 2003

(30) Foreign Application Priority Data

Mar. 6, 2000 (JP) .................................. 2000-061058

(51) Int. Cl.⁷ .......................... C03C 3/087; C03C 3/097
(52) U.S. Cl. ............................ 501/70; 501/64; 501/71; 65/90
(58) Field of Search .................. 501/64, 70, 71; 65/17.1, 90

(56) References Cited

U.S. PATENT DOCUMENTS

| | | | |
|---|---|---|---|
| 3,833,388 A | 9/1974 | Ohlberg et al. | |
| 4,532,537 A | 7/1985 | Kane | |
| 5,030,593 A | 7/1991 | Heithoff | |
| 5,030,594 A | 7/1991 | Heithoff | |
| 5,071,796 A | 12/1991 | Jones et al. | |
| 5,214,008 A | 5/1993 | Beckwith et al. | |
| 5,656,559 A | 8/1997 | Combes et al. | |
| 5,700,305 A | 12/1997 | Lowe et al. | |
| 5,762,674 A | 6/1998 | Maltby et al. | |
| 6,218,323 B1 * | 4/2001 | Bretschneider et al. | 501/71 |
| 6,407,021 B1 * | 6/2002 | Kitayama et al. | 501/70 |
| 6,548,434 B2 * | 4/2003 | Nagashima | 501/70 |
| 6,610,622 B1 * | 8/2003 | Landa et al. | 501/64 |
| 2003/0144126 A1 * | 7/2003 | Kitayama et al. | 501/70 |
| 2003/0199384 A1 * | 10/2003 | Landa et al. | 501/71 |

FOREIGN PATENT DOCUMENTS

| | | |
|---|---|---|
| EP | 0 653 387 | 5/1995 |
| JP | 3-170344 | 7/1991 |
| JP | 4-228450 | 8/1992 |
| JP | 4-228451 | 8/1992 |
| JP | 5-221683 | 8/1993 |
| JP | 6-150742 | 5/1994 |
| JP | 7-41337 | 2/1995 |
| JP | 7-29810 | 4/1995 |
| JP | 7-198245 | 8/1995 |
| JP | 7-283432 | 10/1995 |
| JP | 8-715 | 1/1996 |
| JP | 8-40742 | 2/1996 |
| JP | 8-171015 | 7/1996 |
| JP | 8-506314 | 7/1996 |
| JP | 10-045424 | 2/1998 |
| JP | 10-180947 | 7/1998 |
| JP | 10-186128 | 7/1998 |
| JP | 10-223146 | 8/1998 |
| JP | 10-226534 | 8/1998 |
| JP | 10-297934 | 11/1998 |
| JP | 2000-143283 | 5/2000 |
| JP | 2000-143284 | 5/2000 |
| JP | 2001-058851 | 3/2001 |
| WO | 94/18135 | 8/1994 |
| WO | WO 2000-12441 A1 * | 3/2000 ........... C03C/3/087 |

OTHER PUBLICATIONS

Machine Translation of JP 2000–143283.*
Jesus Arribas Gila, May 1967, VIII Annual Meeting of Spanish Ceramic Society, "Composition and fabrication of glass molds".
Dragos et al., 1978, *Industria Usoara*, 12:456459, Studies on the manufacture of thermoabsorbent glass using the Pittsburgh process.

* cited by examiner

*Primary Examiner*—Karl Group
*Assistant Examiner*—Elizabeth A. Bolden
(74) *Attorney, Agent, or Firm*—Merchant & Gould P.C.

(57) ABSTRACT

The present invention is to provide a high transmittance glass sheet that has a composition containing as coloring components, expressed in wt. %, 0.005 to less than 0.02% of total iron oxide in terms of $Fe_2O_3$, less than 0.008% of FeO, and 0 to 0.25% of cerium oxide and having a ratio of FeO in terms of $Fe_2O_3$ to the total iron oxide of lower than 40%, and exhibits high visible light transmittance and solar radiation transmittance. Alternatively, a high transmittance glass sheet is provided that contains not more than 0.06% of total iron oxide and 0.025 to 0.20% of cerium oxide and has a ratio of a fluorescence intensity at 395 nm to a fluorescence intensity at 600 nm of 10% or higher when subjected to ultraviolet irradiation at a wavelength of 335 nm.

50 Claims, 3 Drawing Sheets

FLAT GLASS HAVING HIGH TRANSMITTANCE

TECHNICAL FIELD

The present invention relates to a high transmittance glass sheet, more specifically, a soda-lime glass sheet having high light beam transmittance that is suitable for use for buildings, solar cell panels and the like. Furthermore, this invention relates to a glass sheet that emits fluorescence efficiently under ultraviolet irradiation and is suitable for interior use and use for showcases. Moreover, this invention relates to a method of manufacturing these glass sheets.

BACKGROUND ART

For substantially colorless high transmittance glass sheets, a high purity raw material is used so that an iron content is extremely low with respect to that of a conventional soda-lime glass sheet, thereby obtaining a light colored and high transmittance glass sheet.

For example, an edge coloration clear glass disclosed in JP 7(1995)-29810 B is a soda-lime glass that contains as a coloring agent, expressed in wt. %, less than 0.02% of total iron oxide in terms of $Fe_2O_3$, and has a ratio of ferrous oxide (FeO) to this total iron oxide of at least 0.4. This allows the glass to achieve low coloration and high transmittance. The glass has a luminous transmittance (illuminant C) of at least 87% on a 5.66 mm thickness basis.

In order to attain the above-mentioned properties, this glass has the following features. That is, in terms of a manufacturing method, the glass has a low $SO_3$ content, and a melting operation includes a liquefaction stage and a refining stage as separate stages. Further, in terms of a material, a batch free from limestone and dolomite is used so that an iron content in the glass is lowered.

Furthermore, an edge coloration clear glass disclosed in JP 8(1996)-715 B is obtained by adding trace amounts of Se and CoO to a glass composition having an iron oxide content equivalent to that of the above-mentioned glass so that the glass exhibits a dominant wavelength of 570 to 590 nm that is compatible with wood tones.

In order to obtain a light color tone and high transmittance glass having an iron oxide content equivalent to that of a conventional glass, a method has been known in which an oxidizing agent such as cerium oxide is added so that the content of FeO is lowered, which causes coloration and a decrease in transmittance.

For example, JP 5(1993)-221683 A discloses a clear glass whose radiation light transmittance is regulated. The clear glass has a conventional clear soda-lime glass composition containing, expressed in wt. %, 0.06 to 0.12% of iron as an impurity in terms of $Fe_2O_3$. In the glass, 0.1 to 0.5% of $CeO_2$ is contained as an oxidizing agent so that a ratio of $Fe^{2+}/Fe^{3+}$ in the glass is lowered from a ratio of about 38% in the conventional soda-lime glass sheet to 3 to 10%, thereby attaining high transmittance in a wavelength region in the vicinity of 600 nm or higher.

A method also has been proposed, in which a base composition of a soda-lime glass having a content of iron as an impurity equivalent to that of the conventional glass is changed so that lower coloration is attained.

For example, JP 8(1996)-40742 A discloses a clear glass composition for glass windows that is a soda-lime-silica glass composition containing, expressed in wt. %, a total amount of 0.02 to 0.2% of iron oxide in terms of ferric oxide and having a base composition that contains 69 to 75% of $SiO_2$, 0 to 3% of $Al_2O_3$, 0 to 5% of $B_2O_3$, 2 to 10% of CaO, less than 2% of MgO, 9 to 17% of $Na_2O$, 0 to 8% of $K_2O$, and optionally, fluorine, zinc oxide, zirconium oxide, and less than 4% of barium oxide. In the glass composition, a total content of alkaline-earth metal oxides is not more than 10%. Thus, an absorption band of FeO is shifted to a longer wavelength side, or a slope of the absorption band by FeO is straightened at an infrared side end of the visible region. This allows window glasses to have lower coloration and exhibit more excellent infrared absorption than a soda-lime-silica glass having a conventional base composition.

The edge coloration clear glass disclosed in JP 7(1995)-29810 B is required to have a ratio of the ferrous oxide (FeO) to the total iron oxide of at least 0.4 so that a pure and bright azure color can be obtained as desired.

In order to attain this ratio, a particular manufacturing method in which the melting operation includes the liquefaction stage and the refining stage as separate stages is desirable, and the content of $SO_3$ should be limited to a low level. This results in an excessive cost increase of the glass sheet thus obtained.

In the edge coloration clear glass disclosed in JP 8(1996)-715 B, Se and CoO are contained as coloring agents, thereby causing a decrease in transmittance. Accordingly, the glass is not suitable for applications requiring high transmittance.

In the clear glass disclosed in JP 5(1993)-221683 A, iron oxide contained in an amount equivalent to an iron oxide content of the conventional soda-lime glass sheet is oxidized by adding a required amount of an oxidizing agent such as cerium oxide, so that the ratio of $Fe^{2+}/Fe^{3+}$ of the contained iron oxide is made lower than that in the case of the conventional soda-lime glass sheet.

According to this method, by reducing the absorption of FeO, the absorption in a wavelength region having its peak at a wavelength in the vicinity of 1,000 nm can be reduced. However, the absorption is not reduced to a sufficient degree. Further, the absorption by $Fe_2O_3$ at a wavelength in the vicinity of 400 nm is increased, so that a color tone of the glass becomes yellowish. Thus, the glass is not preferred for use as a high transmittance glass sheet.

Furthermore, since the iron oxide is contained in an amount equivalent to the iron oxide content of the conventional soda-lime glass sheet, in order to lower the ratio of $Fe^{2+}/Fe^{3+}$, it is required that the oxidizing agent be used in a relatively large amount, thereby causing an increase in manufacturing cost of the glass sheet.

Moreover, since the absorption at a wavelength in the vicinity of 400 nm is increased as described above, when used as a substrate for a solar cell, which includes a photoelectric conversion layer of amorphous silicon having the highest sensitivity of energy conversion at a wavelength in the vicinity of 500 to 600 nm, the efficiency of the energy conversion is decreased.

In the glass composition disclosed in JP 8(1996)-40742 A, by changing the base composition of the glass, the soda-lime glass having an iron oxide content equivalent to that of the conventional glass is increased in transmittance.

However, the method disclosed in this publication merely can provide the effect of shifting the absorption of FeO to the longer wavelength side, which is insufficient for use for buildings in which no coloration is desired and applications requiring high transmittance.

Furthermore, in the composition disclosed in this publication, MgO and MgO+CaO are contained in insufficient amounts, respectively, and a resultant inconvenience related to melting is compensated by containing $Na_2O$ in a larger amount than in a conventional case. As a result, water resistance and weather resistance are deteriorated, and thus browning becomes more likely to be caused. Further, this composition is not suitable for mass production from the viewpoint of cost effectiveness.

Furthermore, although the effect disclosed in the publication can be enhanced by adding components such as F, BaO and the like, the addition of these components leads to a cost increase, shortening of a furnace life attributable to the volatilization of F, and release of harmful substances into the air.

DISCLOSURE OF THE INVENTION

In order to solve the afore-mentioned problems in the conventional technique, the present invention is to provide a high transmittance glass sheet that is different from conventional glass sheets. Furthermore, it is another object of the present invention to provide a high transmittance glass sheet that emits fluorescence in the visible region efficiently under ultraviolet irradiation. Moreover, it is still another object of the present invention to provide methods of manufacturing these glass sheets.

That is, one embodiment of a glass sheet according to the present invention (hereinafter, referred to as a first glass sheet according to the present invention) is formed of a composition containing silica as a main component and as coloring components, expressed in wt. %, not less than 0.005% to less than 0.02% of total iron oxide in terms of $Fe_2O_3$ (hereinafter, referred to as T—$Fe_2O_3$), less than 0.008% of FeO, and not more than 0.25% of cerium oxide, and having a ratio of FeO in terms of $Fe_2O_3$ to T—$Fe_2O_3$ (hereinafter, referred to as a FeO ratio) of lower than 40%.

Preferably, this first glass sheet exhibits as optical properties, on a 4.0 mm thickness basis, a solar radiation transmittance of 87.5% or higher, a visible light transmittance of 90.0% or higher, a dominant wavelength of 540 to 580 nm, and an excitation purity if 0.36% or lower, where the visible light transmittance, the dominant wavelength and the excitation purity are measured with the illuminant C.

Another embodiment of the glass sheet according to the present invention (hereinafter, referred to as a second glass sheet according to the present invention) contains silica as a main component and as coloring components, expressed in wt. %, not more than 0.06% of T—$Fe_2O_3$ and 0.025 to 0.20% of cerium oxide, and has a ratio of a fluorescence intensity at a wavelength of 395 nm to a fluorescence intensity at a wavelength of 600 nm (hereinafter, referred to as a fluorescence intensity ratio) of 10% or higher when subjected to ultraviolet irradiation at a wavelength of 335 nm.

EMBODIMENTS OF THE INVENTION

Hereinafter, the present invention will be described by way of preferred embodiments. In the following description, a content of each component is expressed in % that represents wt. %. Further, the values of a visible light transmittance, a dominant wavelength and an excitation purity are based on measurements performed on a 4.0 mm thickness basis using the CIE standard illuminant C. Furthermore, the values of a solar radiation transmittance are also based on measurements performed on the 4.0 mm thickness basis.

(First Embodiment)

Description is directed first to the first glass sheet according to the present invention.

One preferred embodiment of the first glass sheet has, in addition to the above-mentioned optical properties (solar radiation transmittance: 87.5% or higher, visible light transmittance: 90.0% or higher, dominant wavelength: 540 to 580 nm, excitation purity: 0.36% or lower), a composition containing not more than 0.005% of cerium oxide and having a FeO ratio of 22% or higher, and exhibits an excitation purity of 0.25% or lower. This allows a high transmittance glass sheet that achieves a higher degree of colorlessness to be obtained. Preferably, this high transmittance glass sheet is substantially free from cerium oxide.

Another embodiment of the first glass sheet has, in addition to the above-mentioned optical properties, a composition containing 0.02 to 0.25% of cerium oxide and having a FeO ratio of lower than 22%, and exhibits a solar radiation transmittance of 90.0% or higher and a visible light transmittance of 90.5% or higher. This allows a high transmittance glass sheet that exhibits high transmittance, particularly in a region ranging from the visible region to the near-infrared region.

Figure 2:
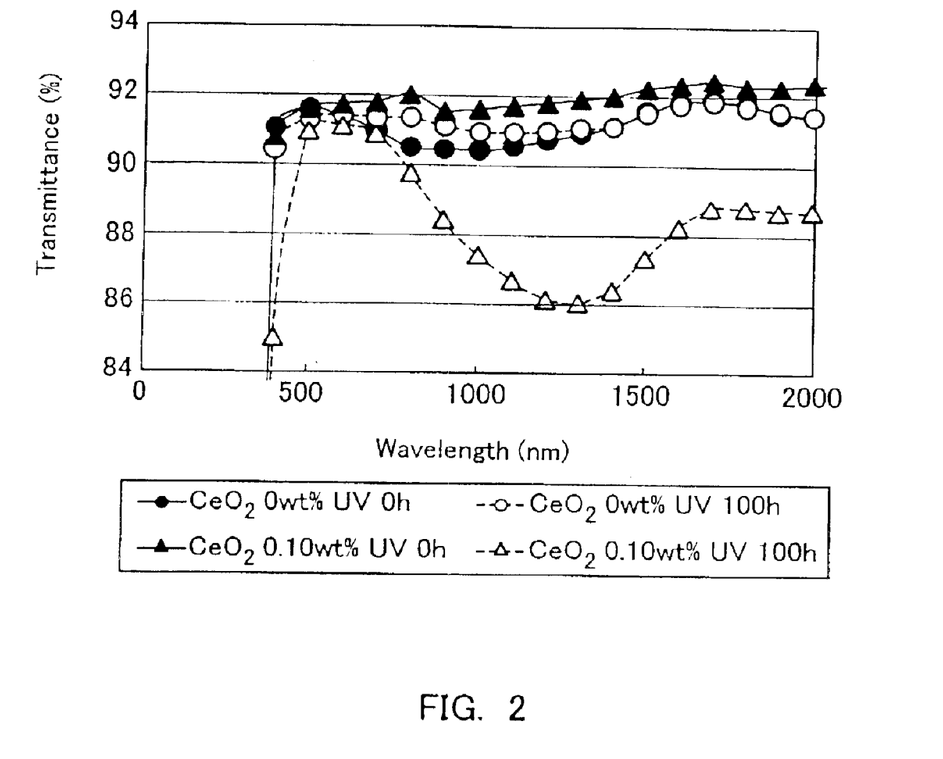
FIG. 2 is a graph showing spectral transmittance curves obtained before and after performing ultraviolet irradiation at a wavelength of not more than 400 nm with respect to a glass sheet having a low iron content, to which cerium oxide is added (0.10 wt. %) and a glass sheet having a low iron content, to which cerium oxide is not added (0 wt. %).

When cerium oxide or the like that acts as an oxidizing agent is added, the transmittance in a region ranging from a longer wavelength side of the visible region to the infrared region is improved, and a high solar radiation transmittance and a high visible light transmittance can be attained. However, the inventors of the present invention have found that when a glass sheet having a T—$Fe_2O_3$ content as low as that described above, to which an oxidizing agent is added, is subjected to ultraviolet irradiation, the transmittance in a region ranging from a longer wavelength side of the visible region to the infrared region is lowered. FIG. 2 shows an example of this phenomenon. As typically shown in the figure, when a glass sheet to which cerium oxide is added is subjected to ultraviolet irradiation, particularly, the transmittance in a region ranging from a longer wavelength side of the visible region to the infrared region may be lowered considerably.

As shown in FIG. 2, as for a glass sheet to which cerium oxide is not added, by ultraviolet irradiation, the transmittance in a region ranging from a longer wavelength side of the visible region to the near-infrared region is increased, and the transmittance in a region ranging from a shorter wavelength side of the visible region to the ultraviolet region is lowered slightly. By using this phenomenon, a spectral transmittance property of a glass sheet can be controlled easily by ultraviolet irradiation.

Figure 3:
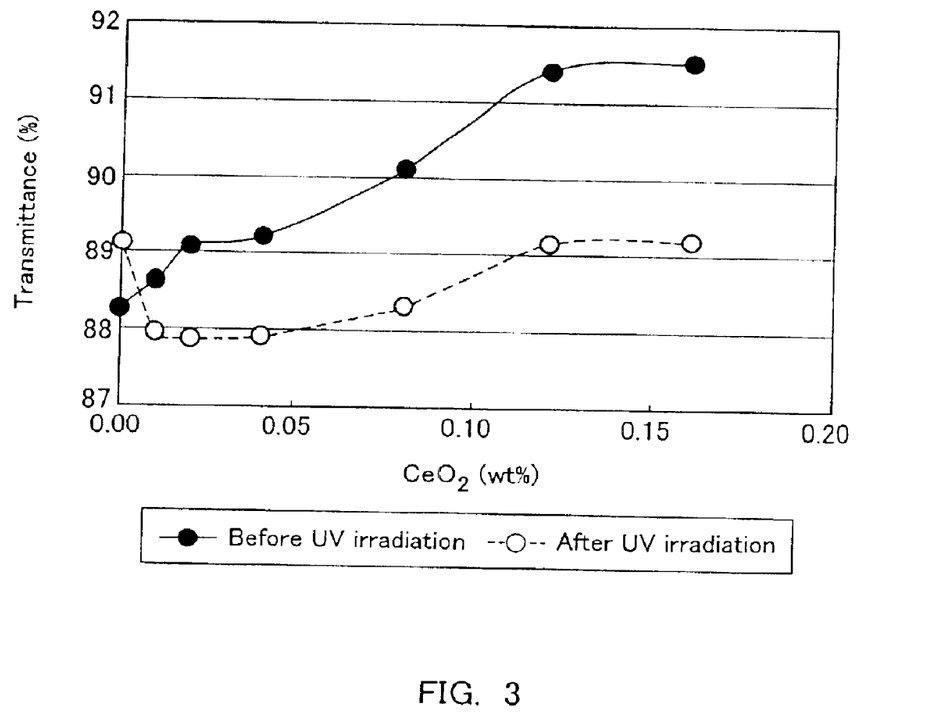
FIG. 3 is a graph showing a relationship between a transmittance at a wavelength of 1,000 nm and a cerium oxide content with respect to each of glass sheets having a low iron content, where the transmittance is measured before and after ultraviolet irradiation at a wavelength of not more than 400 nm.

As confirmed by the inventors of the present invention, for the observation of this phenomenon, preferably, cerium oxide, manganese oxide and vanadium oxide that act as oxidizing agents are not contained substantially. These compounds, however, may be contained as long as their respective amounts are at impurity levels. As for cerium oxide, for example, as shown in FIG. 3, in order to attain an increase in the transmittance in the near-infrared region (transmittance at a wavelength of 1,000 nm is shown in FIG. 3) by ultraviolet irradiation, preferably, the content of the cerium oxide is limited to not more than 0.005%. Similarly, the content of manganese oxide is preferably not more than 0.03%, and the content of vanadium oxide is preferably not more than 0.01%. Thus, a preferred embodiment of the first glass sheet is formed of a composition containing not more than 0.005% of cerium oxide, not more than 0.03% of manganese oxide, and not more than 0.01% of vanadium oxide.

When a glass sheet having limited contents of components acting as oxidizing agents and a T—$Fe_2O_3$ content reduced to not more than 0.02% is subjected to ultraviolet irradiation at a wavelength of not more than 400 nm, the transmittance at a wavelength of 1,000 nm can be improved by not less than 0.1%, in some cases, by not less than 0.3%. Although not entirely clarified, conceivably, lowering of a FeO ratio contributes to the improvement in the transmittance in the near-infrared region, which have been confirmed by Examples (Examples 19 to 30) that will be described later. For example, even when a glass sheet has a FeO ratio of 22% or higher, ultraviolet irradiation allows the FeO ratio to be decreased to lower than 22%. In each of the Examples that will be described later, by ultraviolet irradiation, a FeO ratio could be decreased by at least 3% to 5% or more, to be lower than 22%.

Here, the variations in the transmittance and the FeO ratio are expressed by differences between values expressed in % obtained before and after variation (a 0.1% increase in transmittance is defined by a +0.1 point difference between transmittance values expressed in %).

The transmittance of the above-mentioned glass sheet in a region ranging from the visible region to the near-infrared region can be improved by the ultraviolet irradiation. Thus, the glass sheet is suitable particularly for use for a substrate for a solar cell panel, a cover glass plate for a solar cell panel or the like because the glass sheet has an advantage in maintaining power generation efficiency for a long period of time.

As is apparent from the foregoing description, one aspect of the present invention resides in a method of manufacturing a high transmittance glass sheet. In the method, the above-mentioned composition of the first glass sheet contains cerium oxide, manganese oxide and vanadium oxide in their limited amounts of not more than 0.005%, not more than 0.03%, and not more than 0.01%, respectively, and the glass sheet is subjected to ultraviolet irradiation at a wavelength of not more than 400 nm. Thus, for example, the transmittance at a wavelength of 1,000 nm can be increased by not less than 0.1%. Further, for example, a FeO ratio of 22% or higher also can be decreased to lower than 22%. There is no particular limit to a light source used for the ultraviolet irradiation, and natural light may be used. However, when subjected to irradiation in advance at the time of shipment using an artificial light source such as an ultraviolet lamp, the glass sheet can be used in a state of having a high transmittance from the beginning.

(Second Embodiment)

Description is directed next to the second glass sheet according to the present invention.

This glass sheet is a high transmittance glass sheet that allows an efficient conversion of ultraviolet light into visible light. The efficiency of converting ultraviolet light into visible light can be evaluated by determining the above-mentioned fluorescence intensity ratio after ultraviolet irradiation at a wavelength of 335 nm (the higher a fluorescence intensity, the higher the efficiency of conversion into visible light).

Figure 1:
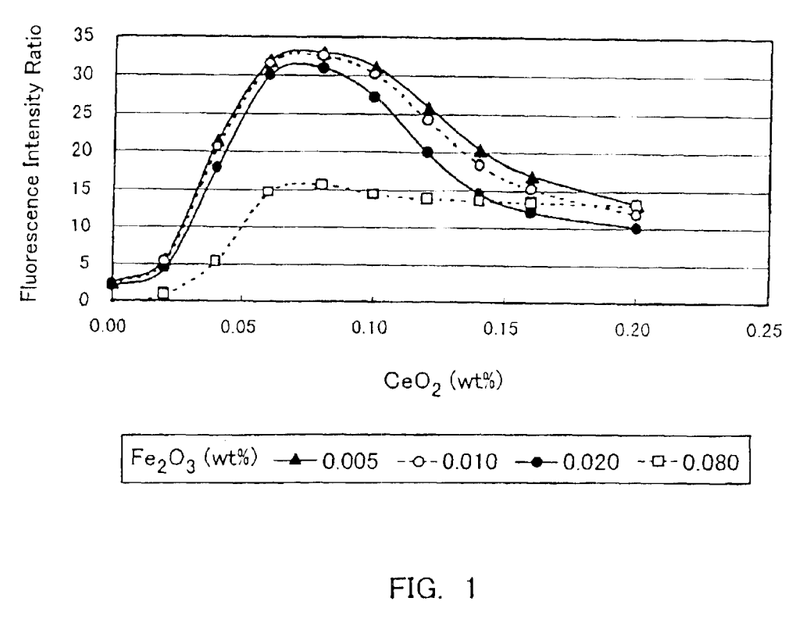
FIG. 1 is a graph showing a relationship between a fluorescence intensity ratio and a cerium oxide content with respect to each of glass sheets that vary in T—$Fe_2O_3$ content.

With respect to glass sheets having predetermined T—$Fe_2O_3$ contents, respectively, a relationship between a cerium oxide content and a fluorescence property was examined, and the results are shown in FIG. 1. As shown in the figure, each of the glass sheets having a T—$Fe_2O_3$ content of less than 0.08%, for example, not more than 0.06%, preferably not more than 0.02%, and a cerium oxide content of 0.025 to 0.20%, preferably in the range of 0.03 to 0.15%, exhibited a high fluorescence intensity ratio.

One preferred embodiment of the second glass sheet is a high transmittance glass sheet containing 0.03 to 0.15% of cerium oxide and exhibiting a fluorescence intensity ratio of 15% or higher. Furthermore, when the high transmittance glass sheet is formed so as to contain 0.05 to 0.12% of cerium oxide and exhibit a fluorescence intensity ratio of 25% or higher, ultraviolet light can be converted into visible light efficiently without using a considerable amount of relatively expensive cerium oxide. The fluorescence intensity ratio varies depending greatly on the respective contents of iron oxide (T—$Fe_2O_3$) and cerium oxide. However, conceivably, the fluorescence intensity ratio is determined not only by these contents but also by other factors such as other trace constituents, a FeO ratio and the like.

When ultraviolet rays are incident on an edge surface of this high transmittance glass sheet, the glass sheet takes on a fluorescent color with gradations. This fluorescent color is suitable particularly for use for interior glasses, showcases, display cases or the like. Furthermore, when used for a substrate for a solar cell panel or a cover glass plate for the solar cell panel, the above-mentioned high transmittance glass sheet converts energy in the ultraviolet region, which hardly contributes to power generation, into light in the visible region, thereby allowing power generation efficiency to be enhanced.

As is apparent from the foregoing description, one aspect of the present invention resides in a method of using a high transmittance glass sheet (method of converting a wavelength of a light beam using fluorescence) in which the second glass sheet is irradiated with ultraviolet light of a wavelength of not more than 400 nm so that a part of the ultraviolet light is converted into visible light.

The following description is directed to base glass components or the like as common features to both the embodiments described above.

Preferably, the base glass components are 65 to 80% of $SiO_2$, 0 to 5% of $Al_2O_3$, 0 to 7% of MgO, 5 to 15% of CaO, 10 to 18% of $Na_2O$, 0 to 5% of $K_2O$, 7 to 17% of MgO+CaO (exclusive of 7%), 10 to 20% of $Na_2O+K_2O$, and 0.05 to 0.3% of $SO_3$. Further, it is preferable that more than 10% of MgO+CaO and more than 0.1% of $SO_3$ are contained. Further, it is preferable that more than 0.5% of MgO is contained from the viewpoint of improving meltability and formability. Further, it is preferable that more than 0.5% of $Al_2O_3$ is contained from the viewpoint of improving water resistance.

Preferably, the above composition is substantially free from fluorine, boron oxide, barium oxide and strontium oxide. This is because the absence of these components allows the generation of harmful substances to be prevented, and thus deterioration of a melting furnace can be suppressed. Further, preferably, the above composition is substantially free from coloring components other than iron oxide, cerium oxide and manganese oxide.

As described above, still another aspect of the present invention resides in use of the high transmittance glass sheet according to the present invention or a method of using the same for any one application selected from the group consisting of an interior glass, a showcase, a display case, a high transmittance window glass, a high transmittance mirror, a glass substrate for a solar cell panel, a cover glass plate for a solar cell panel, a solar water heater, a solar-heat transmittance window glass, and a flat-panel display substrate glass. This allows the high transmittance glass sheet according to the present invention to give considerable effects in terms of high transmittance, colorlessness, a wavelength conversion property and the like.

Although not particularly limited thereto, preferably, the non-colored high transmittance glass sheet according to the present invention is obtained in such a manner that a batch material for the glass sheet is melted in a top-heating tank-type melting furnace and further is refined. When melting and refining are performed in one tank, the glass sheet can be manufactured at a reduced cost.

Hereinafter, the composition of the high transmittance glass sheet according to the present invention will be described.

In glass, iron oxide is present in a form of $Fe_2O_3$ or FeO. $Fe_2O_3$ serves to enhance an ultraviolet-absorbing ability, and FeO serves to enhance a heat-absorbing ability. In order to attain substantial colorlessness and high transmittance, the contents of T—$Fe_2O_3$ and FeO are required to be not more than 0.02% and less than 0.008%, respectively, and a FeO ratio is required to be lower than 40%. When the contents of T—$Fe_2O_3$ and FeO and the FeO ratio reach and become greater than their respective upper limits, the visible light transmittance becomes too low, and a blue tone of FeO is intensified.

When the content of T—$Fe_2O_3$ is less than 0.005%, it is necessary to use high purity materials having low iron contents. This leads to a substantial cost increase. Thus, preferably, T—$Fe_2O_3$ is contained in an amount of not less than 0.005%.

When used for a solar cell having a photoelectric conversion layer using amorphous silicon, a glass sheet preferably has a high transmittance at a wavelength in the vicinity of 500 to 600 nm and exhibits moderate solar radiation absorption. In this case, preferably, when the content of T—$Fe_2O_3$ is in the above-mentioned range, the content of FeO is more than 0.003%, and the FeO ratio is 22% or higher.

When used for a solar cell having a photoelectric conversion layer using crystalline silicon or the like, preferably, a glass sheet has a high transmittance at a wavelength in the vicinity of 1,000 nm. In this case, preferably, when the content of T—$Fe_2O_3$ is in the above-mentioned range, the content of FeO is less than 0.004%, and the FeO ratio is lower than 22%.

Cerium oxide is effective in regulating the content of FeO and a FeO ratio. Particularly, in order to attain a low FeO content and a low FeO ratio required when high transmittance at a wavelength in the vicinity of 1,000 nm is desired, generally, cerium oxide should be added in an amount of 0.02 to 0.25%. In this case, however, in some applications, consideration should be given to variations in transmittance caused by ultraviolet radiation as shown in FIG. 2.

$SiO_2$ is a main component forming a skeleton of a glass. When the content of $SiO_2$ is less than 65%, the durability of the glass is decreased, and when the content of $SiO_2$ is more than 80%, melting of the glass is hindered.

$Al_2O_3$ serves to improve the durability and the water resistance of the glass. However, when the content of $Al_2O_3$ is more than 5%, melting of the glass is hindered. In order to improve the durability and the water resistance, preferably, the content of $Al_2O_3$ is more than 0.5%. More preferably, the content of $Al_2O_3$ is in the range of 1.0 to 2.5%.

Both MgO and CaO serve to improve the durability of the glass and are used to regulate the liquidus temperature and the viscosity of the glass in a forming process. When the content of MgO exceeds 7%, the liquidus temperature is increased excessively. MgO allows a low liquidus temperature to be maintained when contained in a moderate amount. Thus, the content of MgO is preferably more than 0.5%, and more preferably not less than 2%. On the other hand, when the content of CaO is less than 5%, the meltability is degraded. Further, when the content of CaO exceeds 15%, the liquidus temperature is increased. Thus, preferably, the content of CaO is less than 13%. When a total content of MgO and CaO is not more than 7%, the durability of the glass is decreased. Conversely, when the total content exceeds 17%, the liquidus temperature is increased. Thus, preferably, the total content is not more than 15%. In the case where the total content of MgO and CaO is as small as, for example, not more than 10%, it is required that the content of $Na_2O$ be increased so that the degradation of the meltability and an increase in viscosity of a melt are compensated. This leads to a cost increase and a decrease in chemical durability of the glass. Thus, preferably, the total content of MgO and CaO is more than 10%.

Both $Na_2O$ and $K_2O$ are used as melting accelerators of the glass. When the content of $Na_2O$ is less than 10% or when a total content of $Na_2O$ and $K_2O$ is less than 10%, only a poor effect of accelerating glass melting can be obtained. It is not preferable that the content of $Na_2O$ exceeds 18% or the total content of $Na_2O$ and $K_2O$ exceeds 20% since this results in a decrease in durability of the glass. In applications where water resistance is required particularly, the content of $Na_2O$ is preferably not more than 15%, and more preferably not more than 14.5%. Since a material cost of $K_2O$ is high compared with $Na_2O$, it is not preferable that the content of $K_2O$ exceeds 5%.

$SO_3$ serves to accelerate refining of the glass. When the content of $SO_3$ is less than 0.05%, a sufficient refining effect cannot be attained by a regular melting method. Thus, preferably, the content of $SO_3$ is more than 0.1%. Conversely, when the content of $SO_3$ exceeds 0.3%, $SO_2$ produced as a result of decomposition of $SO_3$ remains in the glass in the form of a bubble, and $SO_3$ that has been dissolved becomes more likely to produce bubbles by reboiling.

Although not an indispensable component, $TiO_2$ can be added in a proper amount for the purpose of enhancing an ultraviolet-absorbing ability or the like as long as the amount is in the range that allows the optical properties that are the intended properties of the present invention not to be impaired. When an excessive amount of $TiO_2$ is contained, the glass becomes more likely to become yellowish, and the transmittance at a wavelength in the vicinity of 500 to 600 nm is lowered. Thus, preferably, the content of $TiO_2$ is limited to a low level in the range of less than 0.2%.

As long as the objects of the present invention can be attained, fluorine, boron oxide, barium oxide, and strontium oxide may be contained. However, these components create adverse impacts such as a cost increase, shortening of a furnace life, release of harmful substances into the air or the like. Thus, preferably, these components are not contained substantially.

In the case where an oxidizing agent is added, it is preferable to use cerium oxide in an amount in the range defined above in view of the effect of cerium oxide and an ultraviolet-absorbing effect as another particular effect of cerium oxide. However, an oxidizing agent other than cerium oxide, for example manganese oxide, may be added in an amount in the range of not more than 1% in combination with cerium oxide or as a sole oxidizing agent.

Furthermore, $SnO_2$ may be added as a reducing agent in an amount in the range of not more than 1%. Moreover, at the same time, at least one other coloring component selected from the group consisting of Se, CoO, $Cr_2O_3$, NiO, $V_2O_5$, $MoO_3$ and the like may be added as a coloring agent, in an amount in the range that allows the high transmittance, which is an intended property of the present invention, not to be impaired. However, the addition of these coloring agents leads to an intensified color tone and a decrease in visible light transmittance. Thus, preferably, the other coloring components are not added substantially.

EXAMPLE

Hereinafter, the present invention will be described in detail by way of examples. However, the present invention is not limited to the following Examples.

Examples 1 to 18

Glass batch materials having compositions shown in Tables 1 to 3, in which the respective contents are expressed in terms of oxide and in wt. %, were prepared by using low-iron alumina-containing silica sand, limestone, dolomite, soda ash, salt cake, magnesium oxide, cerium oxide, manganese dioxide, and a carbon-based reducing agent as required. Each batch of these materials was heated in an electric furnace to a temperature of 1,450° C. to be melted. After four hours of melting, the batch was poured onto a stainless steel plate and annealed to room temperature, so that a glass having a thickness of about 10 mm was obtained. Then, this glass sheet was ground to a thickness of 4.0 mm.

With respect to each of the glass sheets thus obtained, measurements were performed using the illuminant C for optical properties that are a visible light transmittance, a dominant wavelength, and an excitation purity, and measurements of a solar radiation transmittance also were performed.

Furthermore, each of the glass sheets was subjected to ultraviolet irradiation at a wavelength of 335 nm for measurements of emission intensity at the respective wavelengths. The respective values of a fluorescence intensity ratio (fluorescence intensity at 395 nm/fluorescence intensity at 600 nm) are also shown in Tables 1 to 3. Further, water resistance was determined according to JIS (Japanese Industrial Standards) R3502-1995 (Section 3.1 "alkali elution test"). The water resistance of each of the glass sheets can be evaluated using an elution amount of alkali ($Na_2O$; mg) obtained by this test.

Tables 1 to 3 show the results of these measurements.

TABLE 1

| Example | 1 | 2 | 3 | 4 | 5 | 6 |
|---|---|---|---|---|---|---|
| $SiO_2$ | 71.1 | 70.4 | 69.8 | 69.8 | 68.0 | 71.6 |
| $Al_2O_3$ | 1.8 | 2.0 | 2.9 | 4.8 | 2.5 | 0.2 |
| MgO | 4.4 | 2.1 | 3.9 | 2.1 | 5.9 | 4.8 |
| CaO | 9.0 | 11.2 | 7.8 | 8.9 | 8.1 | 7.2 |
| $Na_2O$ | 12.6 | 12.9 | 14.6 | 13.2 | 14.3 | 15.1 |
| $K_2O$ | 0.8 | 1.1 | 0.7 | 0.9 | 0.9 | 0.9 |
| $SO_3$ | 0.23 | 0.22 | 0.28 | 0.22 | 0.27 | 0.19 |
| $T\text{-}Fe_2O_3$ | 0.019 | 0.019 | 0.018 | 0.018 | 0.016 | 0.016 |
| $TiO_2$ | 0.04 | 0.03 | 0.03 | 0.04 | 0.03 | 0.03 |
| Cerium oxide | 0 | 0 | 0 | 0 | 0 | 0 |
| Manganese oxide | 0 | 0 | 0 | 0 | 0 | 0 |
| Total | 100.0 | 100.0 | 100.0 | 100.0 | 100.0 | 100.0 |
| FeO | 0.005 | 0.007 | 0.006 | 0.005 | 0.004 | 0.006 |
| FeO ratio | 26 | 37 | 33 | 28 | 25 | 38 |
| Visible light transmittance | 91.4 | 90.8 | 91.1 | 91.4 | 91.5 | 90.9 |
| Solar radiation transmittance | 90.3 | 89.1 | 89.8 | 90.3 | 90.7 | 89.5 |
| Dominant wavelength | 558 | 552 | 553 | 557 | 562 | 552 |
| Excitation purity | 0.19 | 0.18 | 0.18 | 0.18 | 0.19 | 0.17 |
| Fluorescence intensity ratio | 0 | 0 | 0 | 0 | 0 | 0 |
| Elution amount of $Na_2O$ | 0.59 | 0.80 | 0.50 | 0.15 | 0.76 | 1.69 |

TABLE 2

| Example | 7 | 8 | 9 | 10 | 11 | 12 |
|---|---|---|---|---|---|---|
| $SiO_2$ | 71.7 | 71.7 | 71.6 | 71.6 | 71.5 | 71.5 |
| $Al_2O_3$ | 1.7 | 1.7 | 1.7 | 1.7 | 1.7 | 1.7 |
| MgO | 4.2 | 4.2 | 4.2 | 4.2 | 4.2 | 4.2 |
| CaO | 8.5 | 8.5 | 8.5 | 8.5 | 8.5 | 8.5 |

TABLE 2-continued

| Example | 7 | 8 | 9 | 10 | 11 | 12 |
|---|---|---|---|---|---|---|
| $Na_2O$ | 13.0 | 13.0 | 13.0 | 13.0 | 13.0 | 13.0 |
| $K_2O$ | 0.7 | 0.7 | 0.7 | 0.7 | 0.7 | 0.7 |
| $SO_3$ | 0.12 | 0.12 | 0.12 | 0.12 | 0.12 | 0.12 |
| $T-Fe_2O_3$ | 0.015 | 0.015 | 0.015 | 0.015 | 0.015 | 0.015 |
| $TiO_2$ | 0.02 | 0.02 | 0.02 | 0.02 | 0.02 | 0.02 |
| Cerium oxide | 0 | 0.04 | 0.06 | 0.10 | 0.14 | 0.20 |
| Manganese oxide | 0 | 0 | 0 | 0 | 0 | 0 |
| Total | 100.0 | 100.0 | 100.0 | 100.0 | 100.0 | 100.0 |
| FeO | 0.004 | 0.003 | 0.003 | 0.002 | 0.002 | 0.001 |
| FeO ratio | 27 | 20 | 20 | 13 | 13 | 7 |
| Visible light transmittance | 91.2 | 91.6 | 91.6 | 91.7 | 91.6 | 91.6 |
| Solar radiation transmittance | 90.0 | 90.7 | 90.6 | 91.0 | 91.0 | 91.3 |
| Dominant wavelength | 554 | 565 | 565 | 570 | 571 | 573 |
| Excitation purity | 0.19 | 0.20 | 0.20 | 0.20 | 0.24 | 0.30 |
| Fluorescence intensity ratio | 2 | 21 | 31 | 28 | 16 | 11 |
| Elution amount of $Na_2O$ | 0.58 | 0.58 | 0.58 | 0.58 | 0.59 | 0.59 |

TABLE 3

| Example | 13 | 14 | 15 | 16 | 17 | 18 |
|---|---|---|---|---|---|---|
| $SiO_2$ | 71.0 | 71.7 | 71.6 | 72.0 | 71.1 | 71.1 |
| $Al_2O_3$ | 1.4 | 1.7 | 1.7 | 1.7 | 1.8 | 1.5 |
| MgO | 4.3 | 4.0 | 4.2 | 4.2 | 4.4 | 6.2 |
| CaO | 8.6 | 8.5 | 8.5 | 8.5 | 9.0 | 8.7 |
| $Na_2O$ | 13.5 | 13.0 | 13.0 | 12.5 | 12.6 | 11.1 |
| $K_2O$ | 0.7 | 0.7 | 0.7 | 0.7 | 0.7 | 1.0 |
| $SO_3$ | 0.22 | 0.23 | 0.20 | 0.21 | 0.23 | 0.23 |
| $T-Fe_2O_3$ | 0.019 | 0.019 | 0.011 | 0.011 | 0.013 | 0.013 |
| $TiO_2$ | 0.03 | 0.03 | 0.04 | 0.04 | 0.04 | 0.04 |
| Cerium oxide | 0.22 | 0.10 | 0.05 | 0.06 | 0.10 | 0.10 |
| Manganese oxide | 0 | 0.06 | 0 | 0.08 | 0 | 0 |
| Total | 100.0 | 100.0 | 100.0 | 100.0 | 100.0 | 100.0 |
| FeO | 0.001 | 0.002 | 0.002 | 0.001 | 0.002 | 0.002 |
| FeO ratio | 5 | 11 | 18 | 9 | 15 | 15 |
| Visible light transmittance | 91.6 | 91.6 | 91.7 | 91.8 | 91.7 | 91.7 |
| Solar radiation transmittance | 91.2 | 91.0 | 91.0 | 91.3 | 90.9 | 90.9 |
| Dominant wavelength | 573 | 570 | 567 | 570 | 568 | 568 |
| Excitation purity | 0.31 | 0.23 | 0.20 | 0.21 | 0.20 | 0.20 |
| Fluorescence intensity ratio | 9 | 26 | 27 | 27 | 28 | 28 |
| Elution amount of $Na_2O$ | 0.79 | 0.57 | 0.52 | 0.44 | 0.53 | 0.44 |

In each of Examples 1 to 18, a solar radiation transmittance of 87.5% or higher (further to 89.0% or higher), a visible light transmittance of 90.0% or higher (further to 90.5% or higher), a dominant wavelength of 540 to 580 nm (further to 545 to 575 nm), and an excitation purity of 0.36% or lower (further to 0.33% or lower) are obtained. In each of the Examples 1 to 7, which is free from cerium oxide and exhibits a FeO ratio of 22% or higher, an excitation purity of 0.25% or lower is obtained, thereby attaining a more preferred color tone. In each of the Examples 8 to 18, which contains 0.02 to 0.25% of cerium oxide and exhibits a FeO ratio of lower than 22%, a solar radiation transmittance of 90.0% or higher and a visible light transmittance of 90.5% or higher are obtained, which indicates that a higher transmittance is likely to be attained. In each of the Examples 8 to 18 containing cerium oxide except for the Example 13 having a high content of cerium oxide, a fluorescence intensity ratio of 10% or higher is obtained.

In each of the Examples 1 to 5 and 7 to 18 containing more than 0.5% of $Al_2O_3$, a $Na_2O$ elution amount of less than 1.0 mg is obtained, which indicates an excellent water resistance. Each of the Examples 1 to 18 has a composition that is substantially free from fluorine, barium oxide, and strontium oxide. The same applies to Examples and Reference Examples that will be described later.

Comparative Examples 1 to 4

Table 4 shows a composition and optical properties of each of Comparative Examples for the present invention. As in the foregoing description, compositions are expressed in wt. %.

TABLE 4

| Comp. Example | 1 | 2 | 3 | 4 |
|---|---|---|---|---|
| $SiO_2$ | 72.4 | 73.07 | 73.50 | 70.80 |
| $Al_2O_3$ | 1.42 | 1.80 | 0.90 | 1.90 |
| MgO | 4.1 | 0.08 | — | 3.70 |
| CaO | 8.0 | 10.11 | 9.00 | 8.90 |
| SrO | — | 0.21 | — | — |
| $Na_2O$ | 13.1 | 14.63 | 15.80 | 13.50 |
| $K_2O$ | 0.72 | 0.01 | 0.29 | 0.60 |
| $SO_3$ | 0.23 | 0.015 | 0.30 | 0.25 |
| $T-Fe_2O_3$ | 0.10 | 0.010 | 0.1 | 0.09 |
| $TiO_2$ | 0.03 | — | 0.04 | — |
| Cerium oxide | — | — | — | 0.20 |
| $ZrO_2$ | — | 0.28 | — | — |
| Total | 100.08 | 99.935 | 99.93 | 99.94 |
| FeO | 0.027 | — | 0.028 | — |
| FeO ratio | 30 | 60 | 31 | — |
| Sheet thickness (mm) | 3.20 | 5.66 | 3.85 | — |
| Visible light transmittance | 90.1 | 90.8 | 89.9* | — |
| Solar radiation transmittance | 85.0 | 88.5 | — | — |
| Ultraviolet transmittance | 60.8 | — | — | — |
| Dominant wavelength | 502 | 490.5 | 541 | — |
| Excitation purity | 0.34 | 0.27 | 0.30 | — |
| Water resistance | 0.51 | 0.68 | 1.14 | — |

*The illuminant A was used as a light source.

Comparative Example 1 represents a typical soda-lime glass sheet. Comparative Example 2 represents an example disclosed in the above-mentioned JP 7(1995)-29810 B. Comparative Example 3 represents an example disclosed in the above-mentioned JP 8(1996)-40742 A. Comparative Example 4 represents an example disclosed in JP 5(1993)-221683 A.

In the Comparative Example 1, compared with the glass sheet according to the present invention, the solar radiation transmittance is low, and the visible light transmittance also is not so high. In the Comparative Example 2, the properties other than the dominant wavelength are at equivalent levels to those of the glass sheet according to the present invention. However, the FeO ratio cannot be increased to 60% by using a conventional melting furnace, thereby creating a need to use a particular melting furnace, which is disadvantageous from the viewpoint of cost effectiveness. A presumption based on the visible light transmittance and the excitation purity of the Comparative Example 3 is that there is practically no difference between color tones of the Comparative Example 3 and the conventional soda-lime glass sheet. Further, because of a $Na_2O$ content as high as 15.8%, the water resistance has a value exceeding 1.0, thereby being unsuitable for applications requiring water resistance. Although the optical properties of a glass of the Comparative Example 4 are not specifically shown, based on a spectral transmittance curve shown in the disclosure, the glass has a transmittance at 400 nm of about 83%, while a conventional soda-lime glass shown for comparison has that of about 87%. In the glass, the FeO content is lowered by the addition of cerium oxide, and thus the content of $Fe_2O_3$ is increased, so that the glass has a low transmittance at a wavelength on a shorter wavelength side of the visible region.

Examples 19 to 30/Reference Examples 1 to 6

Glass sheets of 4 mm thickness were obtained in the same manner as in the cases of the Examples 1 to 18 except that batch materials were prepared by mixing materials so that compositions shown in Table 5 were obtained.

Each of the glass sheets thus obtained was subjected to ultraviolet irradiation according to the "light stability test" specified in JIS R3212-1998, Section 3.9 (cited also in JIS R3205-1998). In this test, in an ultraviolet irradiation device having a mercury lamp using vitreous silica or a light source equivalent thereto, each specimen was placed at a distance of 230 mm from the light source. While the temperature in the device is maintained at 45° C.±5° C., the ultraviolet irradiation was performed with respect to each specimen for 100 hours.

Furthermore, in the same manner as in the cases of the Examples 1 to 18, measurements were performed for a visible light transmittance, a dominant wavelength, an excitation purity and a solar radiation transmittance as well as transmittance at predetermined wavelengths. These optical properties were measured before and after the ultraviolet irradiation. Further, with respect to each specimen, an amount of FeO was measured before and after the ultraviolet irradiation so that variations in a FeO ratio were determined. The results of the measurements are shown in Tables 5 to 9. As in the foregoing description, compositions are expressed in wt. %.

TABLE 5

| Example | 19 | 20 | 21 | 22 |
|---|---|---|---|---|
| $SiO_2$ | 71.1 | 70.4 | 69.8 | 69.8 |
| $Al_2O_3$ | 1.8 | 2.0 | 2.9 | 4.8 |
| MgO | 4.4 | 2.1 | 3.9 | 2.1 |
| CaO | 9.0 | 11.2 | 7.8 | 8.9 |
| $Li_2O$ | 0 | 0 | 0 | 0 |
| $Na_2O$ | 12.6 | 12.9 | 14.6 | 13.2 |
| $K_2O$ | 0.8 | 1.1 | 0.7 | 0.9 |
| $SO_3$ | 0.2 | 0.2 | 0.3 | 0.2 |
| $T-Fe_2O_3$ | 0.015 | 0.015 | 0.015 | 0.016 |
| $TiO_2$ | 0.02 | 0.02 | 0.02 | 0.02 |
| Cerium oxide | 0 | 0 | 0 | 0 |
| Vanadium oxide | 0 | 0 | 0 | 0 |
| Manganese oxide | 0 | 0 | 0 | 0 |
| Total | 99.9 | 99.9 | 100.0 | 99.9 |

TABLE 5-continued

| Before/After test | Before | After | Before | After | Before | After | Before | After |
|---|---|---|---|---|---|---|---|---|
| FeO | 0.003 | 0.002 | 0.003 | 0.002 | 0.003 | 0.002 | 0.003 | 0.002 |
| FeO ratio | 17 | 11 | 17 | 14 | 17 | 11 | 16 | 11 |
| Visible light transmittance | 91.5 | 91.4 | 91.5 | 91.5 | 91.5 | 91.4 | 91.5 | 91.4 |
| Solar radiation transmittance | 90.7 | 91.0 | 90.7 | 90.8 | 90.7 | 91.0 | 90.7 | 91.0 |
| Dominant wavelength | 548 | 571 | 548 | 561 | 548 | 571 | 546 | 571 |
| Excitation purity | 0.11 | 0.33 | 0.11 | 0.20 | 0.11 | 0.33 | 0.11 | 0.32 |
| Transmittance | | | | | | | | |
| 1,000 nm | 90.1 | 91.0 | 90.1 | 90.4 | 90.1 | 91.0 | 90.1 | 90.9 |
| 800 nm | 90.2 | 91.2 | 90.2 | 90.6 | 90.2 | 91.2 | 90.2 | 91.2 |
| 600 nm | 91.4 | 91.4 | 91.4 | 91.4 | 91.4 | 91.4 | 91.4 | 91.4 |
| 400 nm | 91.2 | 90.5 | 91.2 | 90.9 | 91.2 | 90.5 | 91.2 | 90.5 |

TABLE 6

| Example | 23 | 24 | 25 | 26 |
|---|---|---|---|---|
| $SiO_2$ | 68.0 | 71.6 | 71.8 | 71.8 |
| $Al_2O_3$ | 2.5 | 0.2 | 1.7 | 1.7 |
| MgO | 5.9 | 4.8 | 4.2 | 4.2 |
| CaO | 8.1 | 7.2 | 8.5 | 8.5 |
| $Li_2O$ | 0 | 0 | 0 | 0 |
| $Na_2O$ | 14.3 | 15.1 | 13.0 | 13.0 |
| $K_2O$ | 0.9 | 0.9 | 0.7 | 0.7 |
| $SO_3$ | 0.3 | 0.2 | 0.1 | 0.1 |
| $T-Fe_2O_3$ | 0.019 | 0.019 | 0.006 | 0.008 |
| $TiO_2$ | 0.02 | 0.02 | 0.02 | 0.02 |
| Cerium oxide | 0 | 0 | 0 | 0 |
| Vanadium oxide | 0 | 0 | 0 | 0 |
| Manganese oxide | 0 | 0 | 0 | 0 |
| Total | 100.0 | 100.0 | 100.0 | 100.0 |

| Before/After test | Before | After | Before | After | Before | After | Before | After |
|---|---|---|---|---|---|---|---|---|
| FeO | 0.003 | 0.002 | 0.003 | 0.002 | 0.002 | 0.001 | 0.002 | 0.001 |
| FeO ratio | 14 | 9 | 14 | 9 | 29 | 19 | 24 | 15 |
| Visible light transmittance | 91.5 | 91.4 | 91.5 | 91.4 | 91.6 | 91.5 | 91.6 | 91.4 |
| Solar radiation transmittance | 90.5 | 90.8 | 90.4 | 90.7 | 91.0 | 91.3 | 91.0 | 91.2 |
| Dominant wavelength | 541 | 570 | 540 | 570 | 564 | 572 | 562 | 572 |
| Excitation purity | 0.11 | 0.30 | 0.11 | 0.29 | 0.10 | 0.36 | 0.11 | 0.36 |
| Transmittance | | | | | | | | |
| 1,000 nm | 89.8 | 90.6 | 89.7 | 90.5 | 90.8 | 91.4 | 90.6 | 91.4 |
| 800 nm | 90.0 | 91.0 | 90.0 | 90.9 | 90.6 | 91.4 | 90.5 | 91.4 |
| 600 nm | 91.4 | 91.4 | 91.3 | 91.3 | 91.5 | 91.5 | 91.5 | 91.5 |
| 400 nm | 91.1 | 90.5 | 91.1 | 90.5 | 91.2 | 90.5 | 91.2 | 90.5 |

TABLE 7

| Example | 27 | 28 | 29 | 30 |
|---|---|---|---|---|
| $SiO_2$ | 71.8 | 71.8 | 72.4 | 71.8 |
| $Al_2O_3$ | 1.7 | 2.2 | 1.4 | 1.7 |
| MgO | 4.2 | 4.2 | 4.1 | 4.2 |
| CaO | 8.5 | 8.5 | 8.0 | 8.5 |
| $Li_2O$ | 0 | 2.0 | 0 | 0 |
| $Na_2O$ | 13.0 | 105 | 13.1 | 13.0 |
| $K_2O$ | 0.7 | 0.7 | 0.7 | 0.7 |
| $SO_3$ | 0.1 | 0.1 | 0.2 | 0.1 |
| $T-Fe_2O_3$ | 0.010 | 0.012 | 0.016 | 0.018 |
| $TiO_2$ | 0.02 | 0.02 | 0.02 | 0.02 |
| Cerium oxide | 0 | 0 | 0 | 0 |
| Vanadium oxide | 0 | 0 | 0 | 0 |

TABLE 7-continued

| | | | | | | | | |
|---|---|---|---|---|---|---|---|---|
| Manganese oxide | 0 | | 0 | | 0 | | 0 | |
| Total | 100.0 | | 100.0 | | 100.0 | | 100.0 | |
| Before/After test | Before | After | Before | After | Before | After | Before | After |
| FeO | 0.002 | 0.001 | 0.002 | 0.001 | 0.003 | 0.002 | 0.003 | 0.002 |
| FeO ratio | 20 | 13 | 18 | 12 | 16 | 11 | 16 | 11 |
| Visible light transmittance | 91.6 | 91.4 | 91.6 | 91.4 | 91.5 | 91.4 | 91.5 | 91.4 |
| Solar radiation transmittance | 90.9 | 91.2 | 90.8 | 91.1 | 90.7 | 91.0 | 90.6 | 90.9 |
| Dominant wavelength | 559 | 572 | 556 | 572 | 546 | 571 | 543 | 570 |
| Excitation purity | 0.11 | 0.35 | 0.11 | 0.35 | 0.11 | 0.32 | 0.11 | 0.31 |
| Transmittance | | | | | | | | |
| 1,000 nm | 90.5 | 91.3 | 90.4 | 91.2 | 90.1 | 90.9 | 89.9 | 90.7 |
| 800 nm | 90.5 | 91.3 | 90.4 | 91.3 | 90.2 | 91.2 | 90.1 | 91.0 |
| 600 nm | 91.5 | 91.5 | 91.5 | 91.5 | 91.4 | 91.4 | 91.4 | 91.4 |
| 400 nm | 91.2 | 90.5 | 91.2 | 90.5 | 91.2 | 90.5 | 91.1 | 90.5 |

TABLE 8

| Ref. Example | 1 | | 2 | | 3 | |
|---|---|---|---|---|---|---|
| $SiO_2$ | 71.7 | | 71.7 | | 71.7 | |
| $Al_2O_3$ | 1.7 | | 1.7 | | 1.7 | |
| MgO | 4.2 | | 4.2 | | 4.2 | |
| CaO | 8.5 | | 8.5 | | 8.5 | |
| $Li_2O$ | 0 | | 0 | | 0 | |
| $Na_2O$ | 13.0 | | 13.0 | | 13.0 | |
| $K_2O$ | 0.7 | | 0.7 | | 0.7 | |
| $SO_3$ | 0.1 | | 0.1 | | 0.1 | |
| $T\text{-}Fe_2O_3$ | 0.017 | | 0.018 | | 0.020 | |
| $TiO_2$ | 0.02 | | 0.02 | | 0.02 | |
| Cerium oxide | 0.10 | | 0.10 | | 0.10 | |
| Vanadium oxide | 0 | | 0 | | 0 | |
| Manganese oxide | 0 | | 0 | | 0 | |
| Total | 100.0 | | 100.0 | | 100.0 | |
| Before/After test | Before | After | Before | After | Before | After |
| FeO | 0.001 | 0.006 | 0.001 | 0.007 | 0.001 | 0.002 |
| FeO ratio | 3 | 37 | 4 | 36 | 5 | 8 |
| Visible light transmittance | 91.7 | 91.1 | 91.7 | 91.1 | 91.5 | 90.9 |
| Solar radiation transmittance | 91.1 | 88.3 | 91.0 | 88.3 | 90.7 | 88.9 |
| Dominant wavelength | 569 | 569 | 569 | 569 | 570 | 572 |
| Excitation purity | 0.20 | 0.40 | 0.22 | 0.42 | 0.33 | 0.30 |
| Transmittance | | | | | | |
| 1,000 nm | 91.7 | 87.4 | 91.6 | 87.3 | 91.1 | 88.3 |
| 800 nm | 91.9 | 89.7 | 91.8 | 89.9 | 91.5 | 90.3 |
| 600 nm | 91.7 | 91.1 | 91.7 | 91.2 | 91.5 | 91.0 |
| 400 nm | 90.9 | 85.6 | 90.8 | 85.2 | 90.6 | 88.1 |

TABLE 9

| Ref. Example | 4 | 5 | 6 |
|---|---|---|---|
| $SiO_2$ | 71.6 | 71.7 | 71.6 |
| $Al_2O_3$ | 1.7 | 1.7 | 1.7 |
| MgO | 4.2 | 4.2 | 4.2 |
| CaO | 8.5 | 8.5 | 8.5 |
| $Li_2O$ | 0 | 0 | 0 |
| $Na_2O$ | 13.0 | 13.0 | 13.0 |
| $K_2O$ | 0.7 | 0.7 | 0.7 |
| $SO_3$ | 0.1 | 0.1 | 0.1 |

TABLE 9-continued

| | | | | | |
|---|---|---|---|---|---|
| T-Fe$_2$O$_3$ | 0.020 | | 0.016 | | 0.020 |
| TiO$_2$ | 0.02 | | 0.02 | | 0.02 |
| Cerium oxide | 0.10 | | 0.10 | | 0.10 |
| Vanadium oxide | 0 | | 0.05 | | 0.05 |
| Manganese oxide | 0 | | 0.05 | | 0.05 |
| Total | 100 | | 100 | | 100 |

| Before/After test | Before | After | Before | After | Before | After |
|---|---|---|---|---|---|---|
| FeO | 0.001 | 0.006 | 0.003 | 0.007 | 0.001 | 0.005 |
| FeO ratio | 4 | 28 | 17 | 42 | 4 | 24 |
| Visible light transmittance | 91.5 | 90.7 | 91.1 | 83.7 | 91.0 | 90.4 |
| Solar radiation transmittance | 90.9 | 88.4 | 89.6 | 86.0 | 90.7 | 88.9 |
| Dominant wavelength | 570 | 573 | 564 | 547 | 576 | 578 |
| Excitation purity | 0.35 | 0.41 | 0.58 | 1.77 | 0.46 | 0.27 |
| Transmittance | | | | | | |
| 1,000 nm | 91.6 | 87.9 | 89.7 | 87.2 | 91.5 | 88.6 |
| 800 nm | 91.6 | 90.4 | 90.8 | 89.0 | 91.7 | 90.3 |
| 600 nm | 91.6 | 90.8 | 90.8 | 84.8 | 91.2 | 90.6 |
| 400 nm | 90.7 | 86.1 | 86.8 | 84.3 | 90.4 | 88.1 |

In each of Examples 19 to 30, which has a T—Fe$_2$O$_3$ content of not more than 0.02% and is free from a component acting as an oxidizing agent such as cerium oxide, the solar radiation transmittance is increased to 90.0% or higher (further to 90.5% or higher) by the ultraviolet irradiation. Further, the transmittance at a wavelength of 1,000 nm is increased by not less than 0.3%. The visible light transmittance, although somewhat lowered in some cases, is maintained at a level of 90.5% or higher. In contrast to this, in each of Reference Examples 1 to 6, after performing ultraviolet irradiation under the conditions described above, the transmittance at a wavelength of 1,000 nm is decreased to lower than 90.0%.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A high transmittance glass sheet formed of a composition comprising silica as a main component and as coloring components, expressed in wt. %:

greater than or equal to 0.005% to less than 0.02% of total iron oxide in terms of Fe$_2$O$_3$ (T—Fe$_2$O$_3$);

less than 0.008% of FeO; and 0.02 to 0.25% of cerium oxide, wherein the composition has a ratio (FeO ratio) of FeO in terms of Fe$_2$O$_3$ to T—Fe$_2$O$_3$ of lower than 22%; and the glass sheet has, on a 4.0 mm thickness basis, a solar radiation transmittance of 90.0% or higher, a visible light transmittance of 90.5% or higher, a dominant wavelength of 540 to 580 nm, and an excitation purity of 0.36% or lower, where the visible light transmittance, the dominant wavelength, and the excitation purity are measured with illuminant C.

2. The high transmittance glass sheet according to claim 1, wherein the glass sheet is formed of a composition comprising as base glass components, expressed in wt. %:

65 to 80% of SiO$_2$, 0 to 5% of Al$_2$O$_3$, 0 to 7% of MgO, 5 to 15% of CaO, 10 to 18% of Na$_2$O, 0 to 5% of K$_2$O, 7 to 17% of MgO+CaO (exclusive of 7%), 10 to 20% of Na$_2$O+K$_2$O, and 0.05 to 0.3% of SO$_3$.

3. The high transmittance glass sheet according to claim 2, wherein the glass sheet contains more than 10% of MgO+CaO and more than 0.1% of SO$_3$.

4. The high transmittance glass sheet according to claim 2, wherein the glass sheet contains more than 0.5% of MgO.

5. The high transmittance glass sheet according to claim 2, wherein the glass sheet contains more than 0.5% of Al$_2$O$_3$.

6. The high transmittance glass sheet according to claim 2, wherein the glass sheet is substantially free from fluorine, boron oxide, barium oxide and strontium oxide.

7. The high transmittance glass sheet according to claim 2, wherein the glass sheet is substantially free from coloring components other than iron oxide, cerium oxide and manganese oxide.

8. A method of manufacturing a high transmittance glass sheet, the glass sheet being a high transmittance glass sheet as claimed in claim 1, the method comprising melting and refining a batch material for the glass sheet in a top-heating tank-type melting furnace.

9. A glass article comprising a glass sheet, wherein the glass article is selected from the group consisting of an interior glass, a showcase, a display case, a high transmittance window glass, a high transmittance mirror, a glass substrate for a solar cell panel, a cover glass plate for a solar cell panel, a solar water heater, a solar-heat transmittance window glass, and a flat-panel display substrate glass, and wherein the glass sheet is a high transmittance glass sheet as claimed in claim 1.

10. A high transmittance glass sheet comprising silica as a main component and as coloring components, expressed in wt. %:

0.005 to 0.06% of total iron oxide in terms of $Fe_2O_3$ (T—$Fe_2O_3$); and 0.025 to 0.20% of cerium oxide, wherein the glass sheet has a ratio (fluorescence intensity ratio) of a fluorescence intensity at a wavelength of 395 nm to a fluorescence intensity at a wavelength of 600 nm of 10 or higher when subjected to ultraviolet irradiation at a wavelength of 335 nm, and a solar radiation transmittance of 87.5% or higher on a 4.0 mm thickness basis.

11. The high transmittance glass sheet according to claim 10, wherein the glass sheet contains less than or equal to 0.02% of T—$Fe_2O_3$.

12. The high transmittance glass sheet according to claim 10, wherein the glass sheet contains 0.03 to 0.15% of cerium oxide and has a fluorescence intensity ratio of 15 or higher.

13. The high transmittance glass sheet according to claim 12, wherein the glass sheet contains 0.05 to 0.12% of cerium oxide and has a fluorescence intensity ratio of 25 or higher.

14. The high transmittance glass sheet according to claim 10, wherein the glass sheet contains less than 0.05% of T—$Fe_2O_3$.

15. The high transmittance glass sheet according to claim 10, wherein the glass sheet is formed of a composition comprising as base glass components, expressed in wt. %:

65 to 80% of $SiO_2$, 0 to 5% of $Al_2O_3$, 0 to 7% of MgO, 5 to 15% of CaO, 10 to 18% of $Na_2O$, 0 to 5% of $K_2O$, 7 to 17% of MgO+CaO (exclusive of 7%), 10 to 20% of $Na_2O+K_2O$, and 0.05 to 0.3% of $SO_3$.

16. The high transmittance glass sheet according to claim 15, wherein the glass sheet contains more than 0.10% of MgO+CaO and more than 0.1% of $SO_3$.

17. The high transmittance glass sheet according to claim 15, wherein the glass sheet contains more than 0.5% of MgO.

18. The high transmittance glass sheet according to claim 15, wherein the glass sheet contains more than 0.5% of $Al_2O_3$.

19. The high transmittance glass sheet according to claim 15, wherein the glass sheet is substantially free from fluorine, boron oxide, barium oxide and strontium oxide.

20. The high transmittance glass sheet according to claim 15, wherein the glass sheet is substantially free from coloring components other than iron oxide, cerium oxide and manganese oxide.

21. A glass article comprising a glass sheet, wherein the glass article is selected from the group consisting of an interior glass, a showcase, a display case, a high transmittance window glass, a high transmittance mirror, a glass substrate for a solar cell panel, a cover glass plate for a solar cell panel, a solar water heater, a solar-heat transmittance window glass, and a flat-panel display substrate glass, and wherein the glass sheet is a high transmittance glass sheet as claimed in claim 10.

22. A method of manufacturing a glass sheet, the glass sheet being a high transmittance glass sheet formed of a composition comprising silica as a main component and as coloring components, expressed in wt. %:

greater than or equal to 0.005% to less than 0.02% of total iron oxide in terms of $Fe_2O_3$ (T—$Fe_2O_3$);

less than 0.008% of FeO;

less than or equal to 0.005% of cerium oxide;

less than or equal to 0.03% of manganese oxide; and less than or equal to 0.01% of vanadium oxide, wherein the composition has a ratio (FeO ratio) of FeO in terms of $Fe_2O_3$ to T—$Fe_2O_3$ of lower than 40%; and wherein the glass sheet has a solar radiation transmittance of 87.5% or higher on a 4.0 mm thickness basis, the method comprising: forming a glass sheet, and irradiating the glass sheet with ultraviolet irradiation at a wavelength of less than or equal to 400 nm.

23. A method of converting ultraviolet rays into visible light, comprising irradiating a glass sheet with ultraviolet rays so that a part of the ultraviolet rays are converted into visible light, wherein the glass sheet is a high transmittance glass sheet that comprises silica as a main component and as coloring components, expressed in wt. %: 0.005 to 0.06% of T—$Fe_2O_3$; and 0.025 to 0.20% of cerium oxide, wherein, the glass sheet has a ratio (fluorescence intensity ratio) of a fluorescence intensity at a wavelength of 395 nm to a fluorescence intensity at a wavelength of 600 nm of 10 or higher when subjected to ultraviolet irradiation at a wavelength of 335 nm, and a solar radiation transmittance of 87.5% or higher on a 4.0 mm thickness basis.

24. A high transmittance glass sheet formed of a composition comprising silica as a main component and as coloring components, expressed in wt. %:

greater than or equal to 0.005% to less than 0.02% of total iron oxide in terms of $Fe_2O_3$ (T—$Fe_2O_3$);

less than 0.008% of FeO; and less than or equal to 0.25% of cerium oxide, wherein the composition has a ratio (FeO ratio) of FeO in terms of $Fe_2O_3$ to T—$Fe_2O_3$ of lower than 40%;

the glass sheet has a solar radiation transmittance of 87.5% or higher on a 4.0 mm thickness basis;

the composition further comprises as base glass components, expressed in wt. %:

65 to 80% of $SiO_2$,
0 to 5% of $Al_2O_3$,
0 to 7% of MgO,
5 to 15% of CaO,
10 to 18% of $Na_2O$,
0 to 5% of $K_2O$,
7 to 17% of MgO+CaO (exclusive of 7%),
10 to 20% of $Na_2O+K_2O$, and
0.05 to 0.3% of $SO_3$; and
the glass sheet is substantially free from coloring components other than iron oxide, cerium oxide and manganese oxide.

25. A glass article comprising a glass sheet, wherein the glass article is selected from the group consisting of an interior glass, a showcase, a display case, a high transmittance window glass, a high transmittance mirror, a glass substrate for a solar cell panel, a cover glass plate for a solar cell panel, a solar water heater, a solar-heat transmittance window glass, and a flat-panel display substrate glass, and wherein the glass sheet is a high transmittance glass sheet as claimed in claim 24.

26. A high transmittance glass sheet formed of a composition comprising silica as a main component and as coloring components, expressed in wt. %:
greater than or equal to 0.005% to less than 0.02% of total iron oxide in terms of $Fe_2O_3$ (T—$Fe_2O_3$);
less than 0.008% of FeO;
less than or equal to 0.005% of cerium oxide;
less than or equal to 0.03% of manganese oxide; and
less than or equal to 0.01% of vanadium oxide, wherein
the composition has a ratio (FeO ratio) of FeO in terms of $Fe_2O_3$ to T—$Fe_2O_3$ of lower than 40%;
the glass sheet has a solar radiation transmittance of 87.5% or higher on a 4.0 mm thickness basis;
the glass sheet is obtained by being irradiated with ultraviolet rays at a wavelength of less than or equal to 400 nm; and
the glass sheet has, on a 4.0 mm thickness basis, a light beam transmittance at a wavelength of 1,000 nm that is greater than or equal to 0.1% higher than that of the glass sheet before being irradiated with the ultraviolet rays.

27. The high transmittance glass sheet according to claim 26,
wherein the glass sheet is formed of a composition comprising as base glass components, expressed in wt. %:
65 to 80% of $SiO_2$,
0 to 5% of $Al_2O_3$,
0 to 7% of MgO,
5 to 15% of CaO,
10 to 18% of $Na_2O$,
0 to 5% of $K_2O$,
7 to 17% of MgO+CaO (exclusive of 7%),
10 to 20% of $Na_2O+K_2O$, and
0.05 to 0.3% of $SO_3$.

28. The high transmittance glass sheet according to claim 27,
wherein the glass sheet contains more than 10% of MgO+CaO and more than 0.1% of $SO_3$.

29. The high transmittance glass sheet according to claim 27,
wherein the glass sheet contains more than 0.5% of MgO.

30. The high transmittance glass sheet according to claim 27,
wherein the glass sheet contains more than 0.5% of $Al_2O_3$.

31. The high transmittance glass sheet according to claim 27,
wherein the glass sheet is substantially free from fluorine, boron oxide, barium oxide and strontium oxide.

32. The high transmittance glass sheet according to claim 27,
wherein the glass sheet is substantially free from coloring components other than iron oxide, cerium oxide and manganese oxide.

33. A glass article comprising a glass sheet, wherein the glass article is selected from the group consisting of an interior glass, a showcase, a display case, a high transmittance window glass, a high transmittance mirror, a glass substrate for a solar cell panel, a cover glass plate for a solar cell panel, a solar water heater, a solar-heat transmittance window glass, and a flat-panel display substrate glass, and wherein the glass sheet is a high transmittance glass sheet as claimed in claim 26.

34. The high transmittance glass sheet according to claim 26,
wherein the glass sheet has an excitation purity of 0.36% or lower on the 4.0 mm thickness basis.

35. A high transmittance glass sheet formed of a composition comprising silica as a main component and as coloring components, expressed in wt. %:
greater than or equal to 0.005% to less than 0.02% of total iron oxide in terms of $Fe_2O_3$ (T—$Fe_2O_3$);
less than 0.008% of FeO;
less than or equal to 0.005% of cerium oxide;
less than or equal to 0.03% of manganese oxide; and
less than or equal to 0.01% of vanadium oxide, wherein
the composition has a ratio (FeO ratio) of FeO in terms of $Fe_2O_3$ to T—$Fe_2O_3$ of lower than 22%;
the glass sheet has a solar radiation transmittance of 87.5% or higher on a 4.0 mm thickness basis; and
the glass sheet is obtained by being irradiated with ultraviolet rays at a wavelength of less than or equal to 400 nm.

36. The high transmittance glass sheet according to claim 35,
wherein the glass sheet is formed of a composition comprising as base glass components, expressed in wt. %:
65 to 80% of $SiO_2$,
0 to 5% of $Al_2O_3$,
0 to 7% of MgO,
5 to 15% of CaO,
10 to 18% of $Na_2O$,
0 to 5% of $K_2O$,
7 to 17% of MgO+CaO (exclusive of 7%),
10 to 20% of $Na_2O+K_2O$, and
0.05 to 0.3% of $SO_3$.

37. The high transmittance glass sheet according to claim 36,
wherein the glass sheet contains more than 10% of MgO+CaO and more than 0.1% of $SO_3$.

38. The high transmittance glass sheet according to claim 36, wherein the glass sheet contains more than 0.5% of MgO.

39. The high transmittance glass sheet according to claim 36,
wherein the glass sheet contains more than 0.5% of $Al_2O_3$.

40. The high transmittance glass sheet according to claim 36,
wherein the glass sheet is substantially free from fluorine, boron oxide, barium oxide and strontium oxide.

41. The high transmittance glass sheet according to claim 36,
wherein the glass sheet is substantially free from coloring components other than iron oxide, cerium oxide and manganese oxide.

42. A glass article comprising a glass sheet, wherein the glass article is selected from the group consisting of an interior glass, a showcase, a display case, a high transmittance window glass, a high transmittance mirror, a glass substrate for a solar cell panel, a cover glass plate for a solar cell panel, a solar water heater, a solar-heat transmittance window glass, and a flat-panel display substrate glass, and wherein the glass sheet is a high transmittance glass sheet as claimed in claim 35.

43. A high transmittance glass sheet formed of a composition comprising silica as a main component and as coloring components, expressed in wt. %:
greater than or equal to 0.005% to less than 0.02% of total iron oxide in terms of $Fe_2O_3$ (T—$Fe_2O_3$);
less than 0.008% of FeO;
less than or equal to 0.005% of cerium oxide;
less than or equal to 0.03% of manganese oxide; and
less than or equal to 0.01% of vanadium oxide, wherein the composition has a ratio (FeO ratio) of FeO in terms of $Fe_2O_3$ to T—$Fe_2O_3$ of lower than 40%;
the glass sheet is obtained by being subjected to ultraviolet irradiation according to a light stability test specified in Japanese Industrial Standards, R3212; and
the glass sheet has, on a 4.0 mm thickness basis, a light beam transmittance at a wavelength of 1,000 nm that is greater than or equal to 0.3% higher than that of the glass sheet before being subjected to the ultraviolet irradiation, a solar radiation transmittance of 90.0% or higher, and a visible light transmittance of 90.5% or higher.

44. The high transmittance glass sheet according to claim 43,
wherein the glass sheet is formed of a composition comprising as base glass components, expressed in wt. %:
65 to 80% of $SiO_2$,
0 to 5% of $Al_2O_3$,
0 to 7% of MgO,
5 to 15% of CaO,
10 to 18% of $Na_2O$,
0 to 5% of $K_2O$,
7 to 17% of MgO+CaO (exclusive of 7%),
10 to 20% of $Na_2O+K_2O$, and
0.05 to 0.3% of $SO_3$.

45. The high transmittance glass sheet according to claim 44,
wherein the glass sheet contains more than 10% of MgO+CaO and more than 0.1% of $SO_3$.

46. The high transmittance glass sheet according to claim 44,
wherein the glass sheet contains more than 0.5% of MgO.

47. The high transmittance glass sheet according to claim 44,
wherein the glass sheet contains more than 0.5% of $Al_2O_3$.

48. The high transmittance glass sheet according to claim 44,
wherein the glass sheet is substantially free from fluorine, boron oxide, barium oxide and strontium oxide.

49. The high transmittance glass sheet according to claim 44,
wherein the glass sheet is substantially free from coloring components other than iron oxide, cerium oxide and manganese oxide.

50. A glass article comprising a glass sheet, wherein the glass article is selected from the group consisting of an interior glass, a showcase, a display case, a high transmittance window glass, a high transmittance mirror, a glass substrate for a solar cell panel, a cover glass plate for a solar cell panel, a solar water heater, a solar-heat transmittance window glass, and a flat-panel display substrate glass, and wherein the glass sheet is a high transmittance glass sheet as claimed in claim 43.

* * * * *